United States Patent
Behzad et al.

(10) Patent No.: US 8,093,952 B2
(45) Date of Patent: Jan. 10, 2012

(54) METHOD AND SYSTEM FOR PRECISE CURRENT MATCHING IN DEEP SUB-MICRON TECHNOLOGY

(75) Inventors: Arya Behzad, Poway, CA (US); Stephen Chi-Wang Au, San Diego, CA (US); Dandan Li, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 133 days.

(21) Appl. No.: 11/618,152

(22) Filed: Dec. 29, 2006

(65) Prior Publication Data

US 2008/0157875 A1    Jul. 3, 2008

(51) Int. Cl.
*H03F 3/04*    (2006.01)
*H00G 3/10*    (2006.01)

(52) U.S. Cl. .................................. 330/288; 330/285

(58) Field of Classification Search .................. 330/288
See application file for complete search history.

(56) References Cited

U.S. PATENT DOCUMENTS

| | | | |
|---|---|---|---|
| 6,492,874 B1 * | 12/2002 | Shih | 330/288 |
| 6,714,081 B1 * | 3/2004 | Xu | 330/296 |
| 7,218,170 B1 * | 5/2007 | Carter et al. | 327/552 |
| 2006/0061414 A1 * | 3/2006 | North | 327/551 |
| 2006/0097774 A1 * | 5/2006 | Hasegawa | 327/538 |

* cited by examiner

*Primary Examiner* — Robert Pascal
*Assistant Examiner* — Khiem Nguyen
(74) *Attorney, Agent, or Firm* — Thomas, Kayden, Horstemeyer & Risley, LLP

(57) ABSTRACT

Aspects of a method and system for precise current matching in deep sub-micron technology may include adjusting a current mirror to compensate for MOSFET gate leakage currents by using feedback circuits. The feedback circuits may be implemented from active components to create active feedback circuits. If the reference current to be mirrored is noisy, a smoothing effect may be achieved by introducing a low-pass filter coupled to the current mirror design. The active feedback may comprise amplifiers, which may comprise one or more amplifier stages. The amplifier may amplify either a bias voltage error or a bias current error. Furthermore, a transimpedance amplifier may be utilized in the feedback loop. The output bias current of the current mirror may be stabilized dynamically during adjusting. Multiple current sources may be utilized in the current mirrors.

14 Claims, 6 Drawing Sheets

METHOD AND SYSTEM FOR PRECISE CURRENT MATCHING IN DEEP SUB-MICRON TECHNOLOGY

CROSS-REFERENCE TO RELATED APPLICATIONS/INCORPORATION BY REFERENCE

None

FIELD OF THE INVENTION

Certain embodiments of the invention relate to electronic circuit design. More specifically, certain embodiments of the invention relate to a method and system for precise current matching in deep sub-micron technology.

BACKGROUND OF THE INVENTION

A current mirror is a device comprising an input, an output and a common terminal that is typically connected to a power supply or ground. The input may be connected to a current source. Ideally, the output current will then be equal to the input current and therefore the output is said to mirror the input current, thence the name. This should ideally be true for varying loads at the output.

Current mirrors comprised of active electronic circuit elements have been used extensively in analog electronic integrated circuits both as biasing elements and as load devices for amplifier stages. The use of current mirrors may frequently lead to decreased sensitivity to variations of parameters such as temperature or voltage supply. When the bias currents are small, it is often more economical to use current mirrors rather than resistors in order to save die area.

In modern integrated circuit design, current mirrors are often designed using Metal-Oxide Semiconductor Field Effect Transistors (MOSFETs). MOSFETs are normally assumed to have zero gate current. However, modern deep-submicron (fine geometry) Complementary MOS (CMOS) manufacturing processes result in small gate leakage currents through the thin oxide MOSFET devices. These deviations from theory can lead to significant change in the performance of current mirrors, which may ultimately affect the operation and functionality of integrated circuits comprising these current mirrors.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for precise current matching in deep sub-micron technology, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for precise current matching in deep sub-micron technology. Aspects of a method and system may comprise adjusting a current mirror to compensate for MOSFET gate leakage currents by using feedback circuits. The feedback circuits may be implemented from active components to create active feedback circuits. If the reference current to be mirrored is noisy, a smoothing effect may be achieved by introducing a low-pass filter coupled to the current mirror. The active feedback may comprise amplifiers, which may comprise one or more amplifier stages. The amplifier may amplify either a bias voltage error or a bias current error. Furthermore, a transimpedance amplifier may be utilized in the feedback loop. The output bias current of the current mirror may be stabilized dynamically during adjusting. In accordance with various embodiments of the invention, multiple current sources may be utilized in the current mirrors.

Figure 1A:
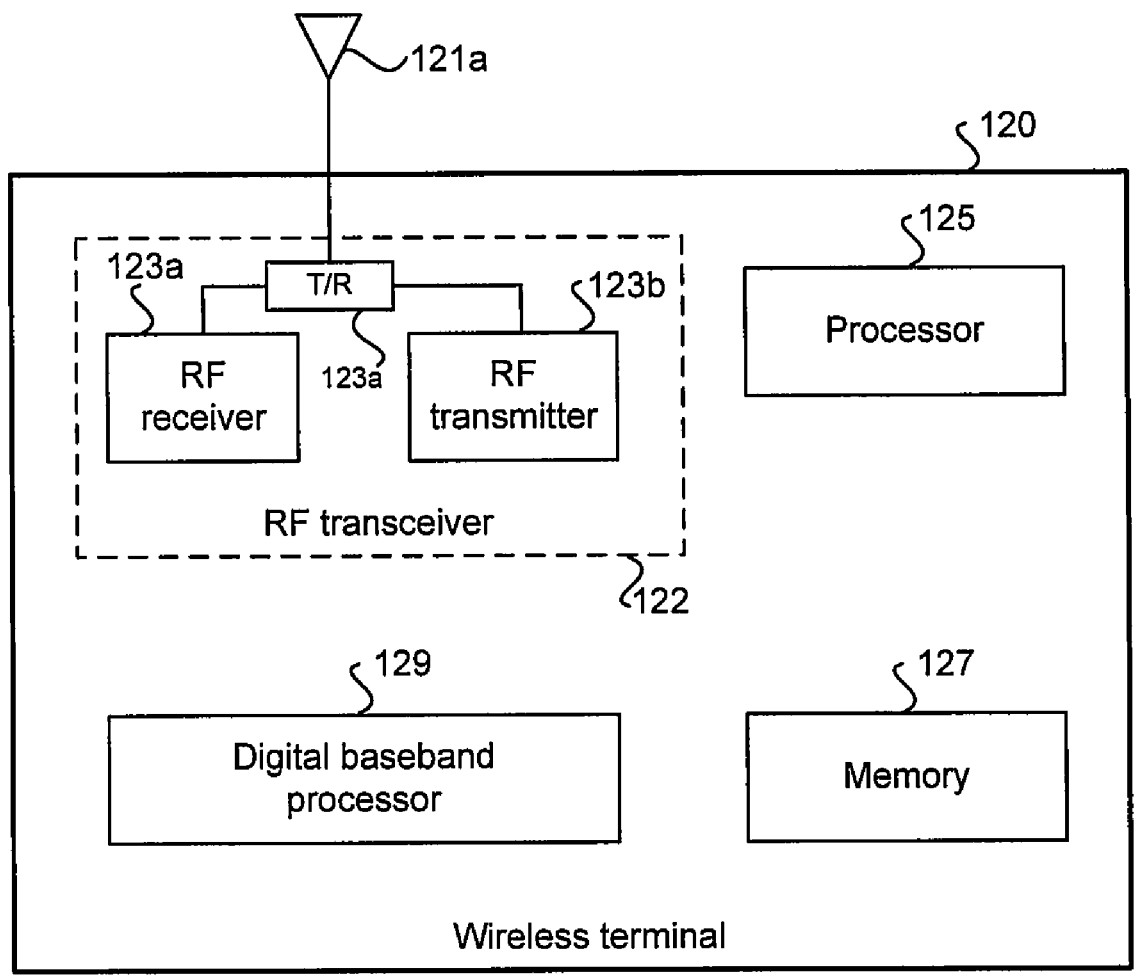
FIG. 1A is a block diagram illustrating an exemplary wireless terminal, in accordance with an embodiment of the invention.

FIG. 1A is a block diagram illustrating an exemplary wireless terminal, in accordance with an embodiment of the invention. Referring to FIG. 1A, there is shown a wireless terminal 120 that may comprise an RF receiver 123a, an RF transmitter 123b, a digital baseband processor 129, a processor 125, and a memory 127. In some embodiments of the invention, the RF receiver 123a and the RF transmitter 123b may be integrated within an RF transceiver 122, for example. A single transmit and receive antenna 121a may be communicatively coupled to the RF receiver 123a and the RF transmitter 123b. A switch or other device having switching capabilities may be coupled between the RF receiver 123a and RF transmitter 123b, and may be utilized to switch the antenna between transmit and receive functions. The wireless terminal 120 may be operated in a system, such as the Wireless Local Area Network (WLAN), a cellular network and/or digital video broadcast network, for example. In this regard, the wireless terminal 120 may support a plurality of wireless communication protocols, including the IEEE 802.11n standard specifications for WLAN networks.

The RF receiver 123a may comprise suitable logic, circuitry, and/or code that may enable processing of received RF signals. The RF receiver 123a may enable receiving RF signals in a plurality of frequency bands in accordance with the wireless communications protocols that may be supported by the wireless terminal 120. Each frequency band supported by the RF receiver 123a may have a corresponding front-end circuit for handling low noise amplification and down conversion operations, for example. In this regard, the RF receiver 123a may be referred to as a multi-band receiver when it supports more than one frequency band. In another embodiment of the invention, the wireless terminal 120 may comprise more than one RF receiver 123a, wherein each of the RF receiver 123a may be a single-band or a multi-band receiver. The RF receiver 123a may be implemented on a chip. In an embodiment of the invention, the RF receiver 123a may be integrated with the RF transmitter 123b on a chip to comprise the RF transceiver 122, for example. In another embodiment of the invention, the RF receiver 123a may be integrated on a chip with more than one component in the wireless terminal 120.

The RF receiver 123a may quadrature down convert the received RF signal to a baseband frequency signal that comprises an in-phase (I) component and a quadrature (Q) component. The RF receiver 123a may perform direct down conversion of the received RF signal to a baseband frequency signal, for example. In some instances, the RF receiver 123a may enable analog-to-digital conversion of the baseband signal components before transferring the components to the digital baseband processor 129. In other instances, the RF receiver 123a may transfer the baseband signal components in analog form.

The digital baseband processor 129 may comprise suitable logic, circuitry, and/or code that may enable processing and/or handling of baseband frequency signals. In this regard, the digital baseband processor 129 may process or handle signals received from the RF receiver 123a and/or signals to be transferred to the RF transmitter 123b, when the RF transmitter 123b is present, for transmission to the network. The digital baseband processor 129 may also provide control and/or feedback information to the RF receiver 123a and to the RF transmitter 123b based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission to the network. In an embodiment of the invention, the digital baseband processor 129 may be integrated on a chip with more than one component in the wireless terminal 120.

The RF transmitter 123b may comprise suitable logic, circuitry, and/or code that may enable processing of RF signals for transmission. The RF transmitter 123b may enable transmission of RF signals in a plurality of frequency bands. Each frequency band supported by the RF transmitter 123b may have a corresponding front-end circuit for handling amplification and up conversion operations, for example. In this regard, the RF transmitter 123b may be referred to as a multi-band transmitter when it supports more than one frequency band. In another embodiment of the invention, the wireless terminal 120 may comprise more than one RF transmitter 123b, wherein each of the RF transmitter 123b may be a single-band or a multi-band transmitter. The RF transmitter 123b may be implemented on a chip. In an embodiment of the invention, the RF transmitter 123b may be integrated with the RF receiver 123a on a chip to comprise the RF transceiver 122, for example. In another embodiment of the invention, the RF transmitter 123b may be integrated on a chip with more than one component in the wireless terminal 120.

The RF transmitter 123b may quadrature up convert the baseband frequency signal comprising I/Q components to an RF signal. The RF transmitter 123b may perform direct up conversion of the baseband frequency signal to a baseband frequency signal, for example. In some instances, the RF transmitter 123b may enable digital-to-analog conversion of the baseband signal components received from the digital baseband processor 129 before up conversion. In other instances, the RF transmitter 123b may receive baseband signal components in analog form.

The processor 125 may comprise suitable logic, circuitry, and/or code that may enable control and/or data processing operations for the wireless terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the wireless terminal 120. The processor 125 may also enable executing of applications that may be utilized by the wireless terminal 120. For example, the processor 125 may generate at least one control signal and/or may execute applications that may enable current and proposed WLAN communications in the wireless terminal 120.

The memory 127 may comprise suitable logic, circuitry, and/or code that may enable storage of data and/or other information utilized by the wireless terminal 120. For example, the memory 127 may be utilized for storing processed data generated by the digital baseband processor 129 and/or the processor 125. The memory 127 may also be utilized to store information, such as configuration information, that may be utilized to control the operation of at least one block in the wireless terminal 120. For example, the memory 127 may comprise information necessary to configure the RF receiver 123a for receiving WLAN signals in the appropriate frequency band.

Figure 1B:
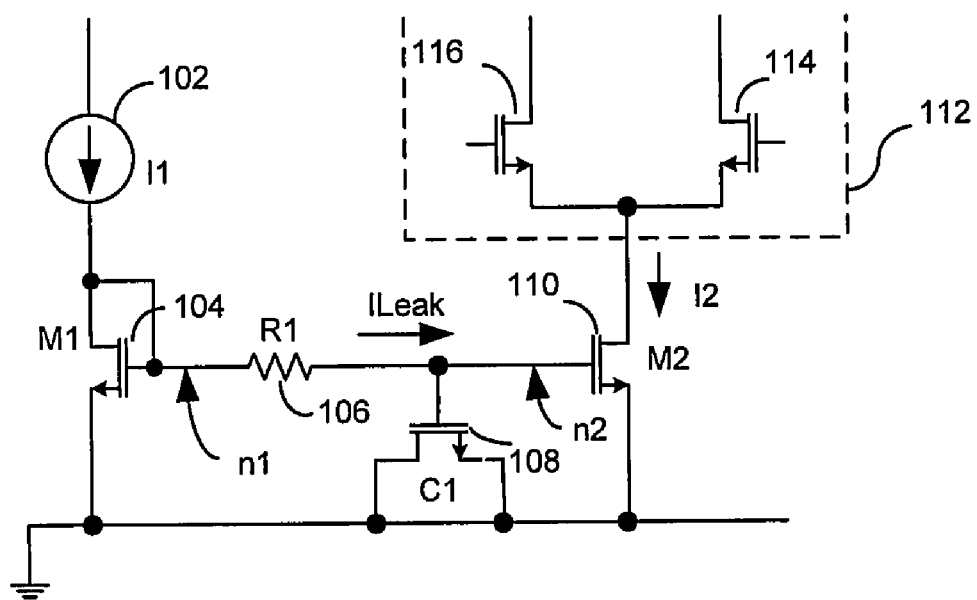
FIG. 1B is a diagram illustrating a circuit schematic with an exemplary bias current scheme, in connection with an embodiment of the invention.

FIG. 1B is a diagram illustrating a circuit schematic with an exemplary bias current scheme, in connection with an embodiment of the invention. Referring to FIG. 1B, there is shown a current source 102, MOSFETs 104, 108, 110, resistor 106 and an exemplary bias current sensitive circuit 112. The exemplary bias current sensitive circuit 112 may comprise MOSFETs 114 and 116. There is also shown in FIG. 1B, currents I1, I2 and ILeak and reference points n1 and n2.

The current I1 may be a reference bias current, which may be generated by the current source 102, and may be very noisy. If a bias current may need to be provided to the exemplary bias current sensitive circuit 112, it may be desirable to use a current mirror that mirrors current I1 in current I2 but with a reduction in noise. This may be achieved in FIG. 1B by introducing a low-pass filter comprising resistor R1 106 and MOSFET C1 108. The MOSFET C1 108 may be functioning like a capacitance in the exemplary configuration illustrated in FIG. 1B.

The MOSFET M1 104 may set up the gate voltage for the MOSFET M2 110 at the reference point n1. The resistor R1 106 and the capacitance C1 provided by the MOSFET 108 may form a low-pass filter and hence may filter out most of the voltage noise at the reference point n1. Since ideally the gates of the MOSFET M2 110 and the MOSFET 108 may draw no current, the voltage at the reference point n2 may be equal to the voltage at the reference point n1 but with reduced noise due to the low-pass filtering of the resistor R1 106 and the capacitance C1 provided by the MOSFET 108. In this case, since the gate-source voltage at the MOSFET M1 104 may be equal to the gate-source voltage at the MOSFET M2 110, the drain current I2 at the MOSFET M2 110 may be well defined by the following relationship:

$$I2/I1 = W2/W1,$$

where W1 and W2 may be the gate width of M1 104 and M2 110, respectively and the gate width is a device characteristic. It may be assumed that the gate length of M1 104 and M2 110 may be equal.

However, in deep-submicron (fine geometry) CMOS manufacturing processes, there may be a gate leakage current through the thin oxide MOSFET devices M2 110 and 108. This gate leakage current ILeak may cause a significant voltage drop across the resistor R1 106 because the resistor R1 106 may have a high resistance value. This voltage drop may result in a voltage difference between the reference points n1 and n2 and may lead to a reduced current I2 since the voltage at the voltage reference point n2 may be smaller than the voltage at the voltage reference point n1.

Figure 2:
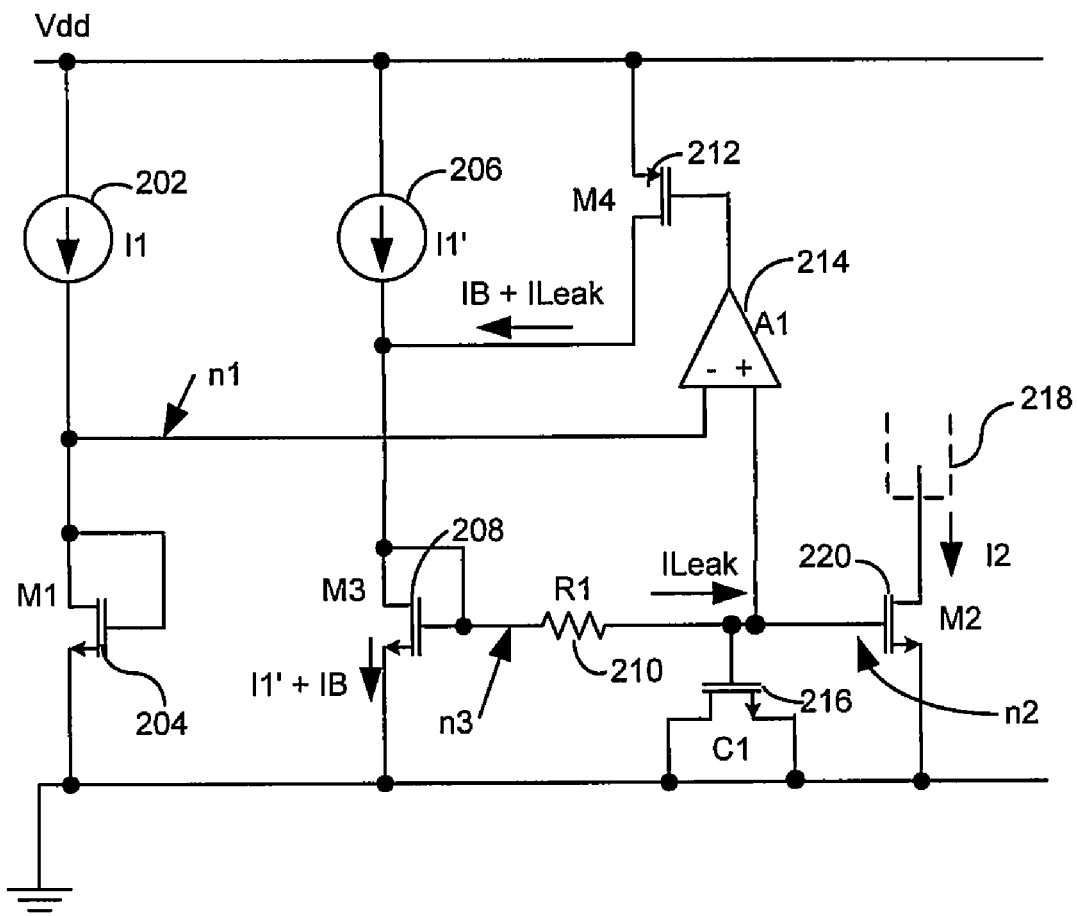
FIG. 2 is a diagram of a circuit that illustrates an exemplary feedback scheme for compensating MOSFET gate leakage currents, in accordance with an embodiment of the invention.

FIG. 2 is a diagram of a circuit that illustrates an exemplary feedback scheme for compensating MOSFET gate leakage currents, in accordance with an embodiment of the invention. Referring to FIG. 2, there is shown current sources 202 and 206, MOSFETs 204, 208, 212, 216 and 220, resistor 210, amplifier 214 and a bias current sensitive circuit 218. The bias current sensitive circuit 218 is symbolically represented only and may comprise any number of components and/or configurations. Reference points n1 and n2 are utilized to indicate reference voltages at points n1 and n2.

The current source I1 202 may be coupled to the drain of MOSFET M1 204 and supply voltage Vdd. The source of MOSFET M1 204 may be coupled to ground and the gate of MOSFET M1 204 may be coupled to the drain of MOSFET M1 204. The current source I1' 206 may be coupled to Vdd and the drain of MOSFET M3 208. The gate of MOSFET M3 208 may be coupled to the drain of MOSFET M3 208, and the source of MOSFET M3 208 may be coupled to ground. The source of MOSFET M4 212 may be coupled to Vdd. The drain of MOSFET M4 212 may be coupled to the drain of MOSFET M3 208 and the gate of MOSFET M4 212 may be coupled to the output of amplifier A1 214. The positive input of amplifier A1 214 may be coupled to the gate of MOSFET C1 216, the gate of MOSFET M2 220 and resistor R1 210. The negative input of amplifier A1 214 may be coupled to the drain of MOSFET M1 204. Resistor R1 210 may be coupled to the gate of MOSFET M3 208 and to the gate of MOSFET M2 220. The drain and source of MOSFET C1 216 may be coupled to ground. The drain of the MOSFET M2 220 may be coupled to the bias current sensitive circuit 218 and the source of MOSFET M2 220 may be coupled to ground.

The current source 202 may generate a current I1, which may be a bias reference current. The bias reference current I1 may flow through the MOSFET M1 204 and may generate a voltage at the reference point n1. The current source 206 may generate a current I1', which may be fed to the MOSFET M3 208 and the low-pass filter, comprising the resistor R1 210 and the MOSFET 216 whose capacitance may be represented as C1. In parallel to current I1' generated by the current source 206, the MOSFET M4 212 may be a variable current source, which may be controlled by the output of the amplifier A1 214. The amplifier A1 214 may sense the reference voltage at voltage reference point n1 and the voltage at the reference point n2. In case there is a difference in the voltage levels at the voltage reference points n1 and n2, the amplifier A1 214 may adjust its output voltage and may change the gate-source voltage at the MOSFET M4 212, and thereby may change the current IB+ILeak. This may lead to a change in the gate-source voltage at the MOSFET M3 208 (Vgs3) until an equilibrium may be reached such that the gate-source voltage, Vgs2, at the MOSFET M2 220 may be represented by the following relationship:

$$Vgs2=Vgs3-ILeak*R1, \text{ and}$$

$$Vgs2=V_{n2}=V_{n1},$$

$V_{n2}$ is the voltage at reference point n2 and $V_{n1}$ is voltage at reference point n1. Hence, M4 212 may compensate for the gate leakage current ILeak. For stability reasons, the amplifier A1 214 may be implemented in multiple, low gain stages.

Figure 3:
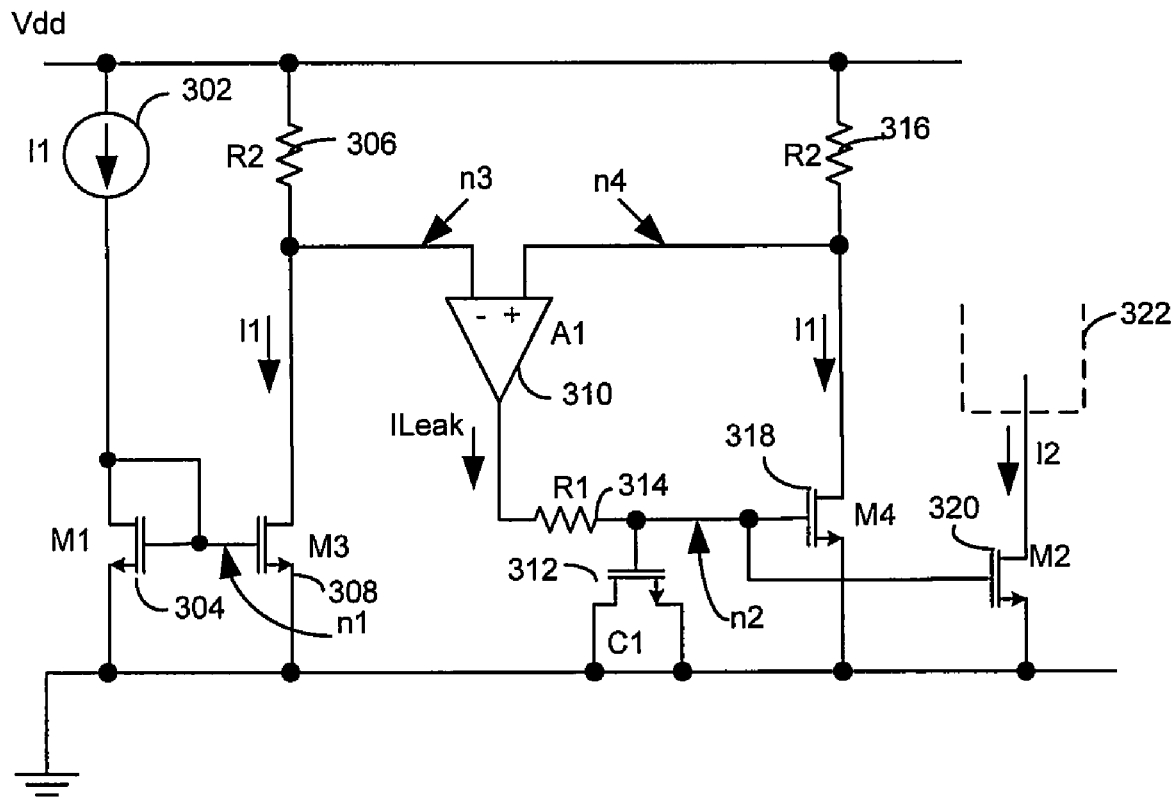
FIG. 3 is a diagram of an exemplary circuit that illustrates exemplary output bias current sensing and compensation, in accordance with an embodiment of the invention.

FIG. 3 is a diagram of an exemplary circuit that illustrates exemplary output bias current sensing and compensation, in accordance with an embodiment of the invention. Referring to FIG. 3, there is shown a current source 302, MOSFETs 304, 308, 312, 318, 320, resistors 306, 314 and 316, an amplifier 310 and a bias current sensitive circuit 322. There is also shown currents I1, ILeak and I2 and voltage reference points n1, n2, n3 and n4.

The current source I1 302 may be coupled to the supply voltage Vdd and to the drain of MOSFET M1 304. The source of MOSFET M1 304 may be coupled to ground and the drain of MOSFET M1 304 may be coupled to the gate of MOSFET M1 304. The gate of MOSFET M1 304 may also be coupled to the gate of MOSFET M3 308. The source of MOSFET M3 308 may be coupled to ground and the drain of MOSFET M3 308 may be coupled to resistor R2 306. The other terminal of resistor R2 306 may be coupled to Vdd. The drain of MOSFET M3 308 may also be coupled to the negative input of amplifier A1 310. The positive input of amplifier A1 310 may be coupled to one terminal of resistor R2 316. The other terminal of resistor R2 316 may be coupled to Vdd. The drain of MOSFET M4 318 may be coupled to the positive input of amplifier A1 310 and the source of MOSFET M4 318 may be coupled to ground. The gate of MOSFET M4 318 may be coupled to the gate of MOSFET C1 312. The drain and the source of MOSFET C1 312 may be coupled to ground. One terminal of resistor R1 314 may be coupled to the output of amplifier A1 310. The other terminal of resistor R1 314 may be coupled to the gate of MOSFET M4 318. The gate of MOSFET M2 320 may be coupled to the gate of MOSFET M4 318 and the source of MOSFET M2 320 may be coupled to ground. The drain of MOSFET M2 320 may be coupled to the bias current sensitive circuit 322.

In accordance with an embodiment of the invention, in operation, the amplifier A1 310 may sense the output bias current with MOSFET M4 318. Since the amplifier A1 310 may force the voltage reference point n3 to be equal to the voltage reference point n4, and given that resistors 306 and 316 are of the same value, the same drain current I1 may flow through the MOSFET M3 308 and the MOSFET M4 318. Hence, the output of amplifier A1 310 may control the gate-source voltage of MOSFET M4 318. This in turn may change the current I1 and therefore may change the voltage at reference point n4, completing the feedback loop. This embodiment of the invention may provide less noise reduction since the output of the amplifier A1 310 may be noisier due to the noisy input at voltage reference point n3. It may be assumed that the MOSFETs M1 304, M3 308 and M4 318 are of the same gate width and length.

Figure 4:
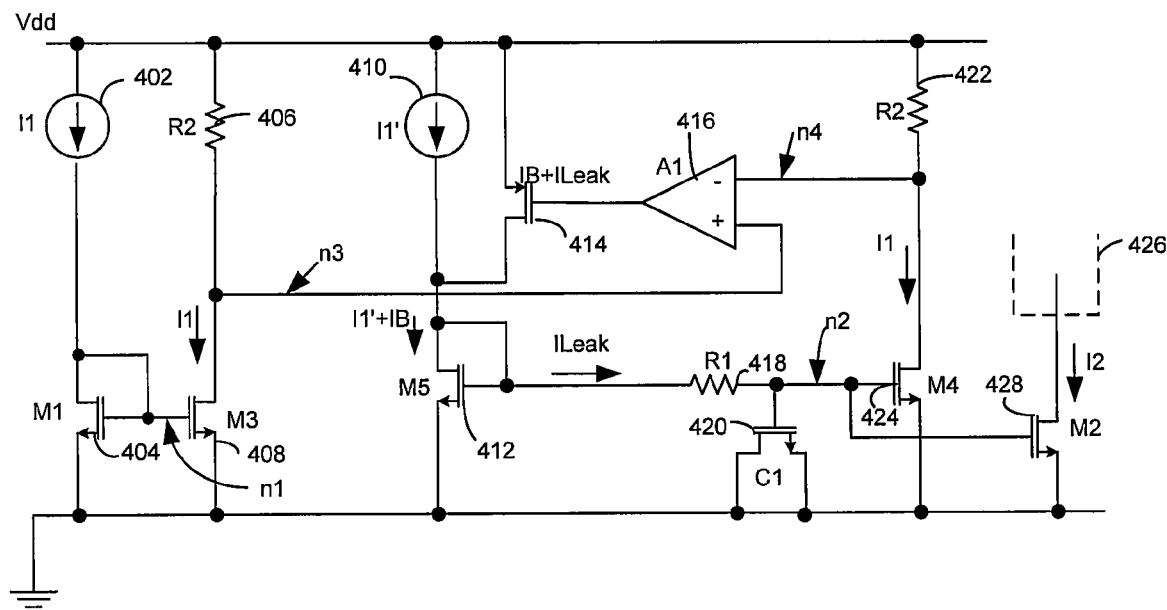
FIG. 4 illustrates another output bias current sensing and compensating method, in accordance with an embodiment of the invention.

FIG. 4 illustrates another output bias current sensing and compensating method, in accordance with an embodiment of the invention. Referring to FIG. 4, there is shown current sources 402 and 410, MOSFETs 404, 408, 412, 414, 420, 424 and 428, resistors 406, 418 and 422, amplifier 416 and bias current sensitive circuit 426. There is also shown currents I1, I1', IB, ILeak and I2 and voltage reference points n1, n2, n3 and n4.

The current source I1 402 may be coupled to the supply voltage Vdd and to the drain of MOSFET M1 404. The drain of MOSFET M1 404 may be coupled to the gate of MOSFET M1 404. The source of MOSFET M1 404 may be coupled to ground. The gate of MOSFET M1 404 may also be coupled to the gate of MOSFET M3 408. The source of MOSFET M3 408 may be coupled to ground and the drain of MOSFET M3 408 may be coupled to one terminal of resistor R2 406. The other terminal of resistor R2 406 may be coupled to Vdd. The current source I1' may be coupled to Vdd and to the drain of MOSFET M5 412. The source of MOSFET M5 may be coupled to ground. The drain and gate of MOSFET M5 412 may connect to one terminal of the resistor R1 418. The other terminal of resistor R1 418 may connect to the gate of MOSFET C1 420. The source and drain of MOSFET C1 420 may connect to ground. The gate of MOSFET C1 420 may also connect to the gate of MOSFET M4 424 and the gate of MOSFET M2 428. The source of MOSFET M4 424 and the source of MOSFET M2 428 may be coupled to ground. The drain of MOSFET M2 428 may be coupled to the bias current sensitive circuit 426. The drain of MOSFET M4 424 may be coupled to the negative input 416 of the amplifier A1 416 and one of the terminals of resistor R2 422. The other terminal of resistor R2 422 may be coupled to Vdd. The positive input of amplifier A1 416 may be coupled to the drain of MOSFET M3 408. The output of amplifier A1 416 may be coupled to the gate of MOSFET 414. The drain of MOSFET 414 may be coupled to the drain of MOSFET M5 412. The source of MOSFET 414 may be coupled to Vdd.

The circuit disclosed in FIG. 4 may operate in a somewhat similar manner to the circuit disclosed in FIG. 3. Notwithstanding, in accordance with an embodiment of the invention, in operation, the amplifier A1 416 may sense the voltage at the voltage reference point n3 and may compare it with the voltage at reference point n4. In instances where the current through the resistor R2 406 may be different from the current through the R2 422, a voltage difference between the voltage reference points n3 and n4 may exist. In this case, the amplifier A1 416 may adjust its output current by controlling the MOSFET M6 414. This may change the gate-source voltage at the MOSFET M5 412, which may in turn change the voltage at the voltage reference point n2, the gate source voltage at the MOSFET M4. Accordingly, changing the voltage a voltage reference point n2 may result in a change in the voltage at the voltage reference point n4. This feedback loop, which comprises MOSFETs M6 414 and M4 424, may force the voltage at voltage reference point n3 to be equal to the voltage at voltage reference point n4. If the MOSFETs M3 408 and M4 424 are assumed to be of the same construction type of the same gate width and gate length, then the voltage at voltage reference point n2 may be forced to be equal to the voltage at voltage reference point n1. Because of the addition of the current source 410, which supplies the current I1' and the MOSFETs M5 412 and M6 414 when comparing FIG. 4 with FIG. 3, this circuit may be more effective at reducing noise. The MOSFETs M1 404, M3 408, M4 424 and M5 412 may be assumed to be of to equal gate width and length.

Figure 5:
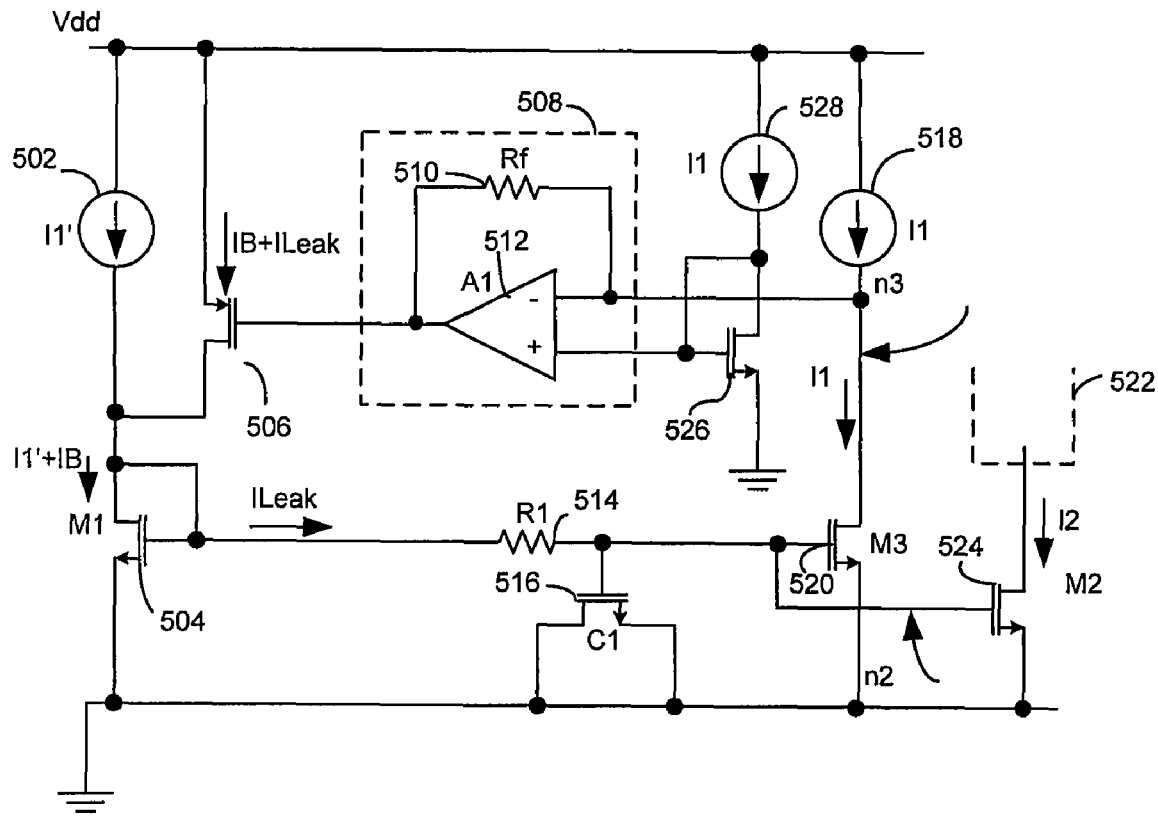
FIG. 5 is a diagram of an output bias control circuit, in accordance with an embodiment of the invention.

FIG. 5 is a diagram of an output bias control circuit, in accordance with an embodiment of the invention. Referring to FIG. 5, there is shown current sources 502, 518 and 528, MOSFETs 504, 506, 516, 520, 524 and 526, a transimpedance amplifier 508, resistor 514 and bias current sensitive circuit 522. Transimpedance amplifier 508 may comprise resistor 510 and amplifier 512. There is also shown currents I1, I1', IB, ILeak and I2 and voltage reference points n2 and n3.

The current source I1' 502 may be coupled to the supply voltage Vdd and the drain of MOSFET M1 504. The source of MOSFET M1 504 may be coupled to ground. The drain of MOSFET M1 504 may be coupled to the gate of MOSFET M1 504. The gate of MOSFET M1 504 may also be coupled to one of the terminals of resistor R1 514. The other terminal of resistor R1 514 may be coupled to the gate of MOSFET C1 516. The drain and source of MOSFET C1 516 may be coupled to ground. The gate of MOSFET C1 516 may also be coupled to the gate of MOSFET M3 520 and the gate of MOSFET M2 524. The source of MOSFET M2 524 may be coupled to ground and the drain of MOSFET M2 524 may be coupled to the bias current sensitive circuit 522. The source of MOSFET M3 may be coupled to ground. The drain of MOSFET M3 520 may be coupled to the negative input of amplifier A1 512.

The positive input of amplifier A1 512 may be coupled to the gate of MOSFET 526. The source of MOSFET 526 may be coupled to ground and the drain of MOSFET 526 may be coupled to current source I1 528. The other terminal of current source I1 528 may be coupled to Vdd. The drain of MOSFET 526 may be coupled to the gate of MOSFET 526. The current source I1 518 may be coupled to Vdd and to the negative input of the amplifier A1 512. The resistor Rf 510 may be coupled to the negative input of the amplifier A1 512 and the output of amplifier A1 512. The output of the amplifier A1 512 may also be coupled to the gate of MOSFET 506. The source of MOSFET 506 may be coupled to Vdd. The drain of MOSFET 506 may be coupled to the drain of MOSFET M1 504.

The output bias current I2 may be sensed by MOSFET M3 520. The voltage at voltage reference point n3 may depend on the current I2 and the gate-source voltage of the MOSFET M3 520. As the voltage at n3 may change, the output of the transimpedance amplifier 508 may change inversely proportionally to the voltage at n3. The change in voltage at the output of the transimpedance amplifier 508 may change the gate-source voltage of MOSFET 506 and may adjust the drain current of MOSFET 506. This in turn may change the gate voltage at MOSFET M1 504 and the voltage at voltage reference point n2. This may complete the feedback action of the feedback loop comprising of the amplifier A1 512 and MOSFETs 506, 504 and 520. The feedback resistor Rf 510 may be chosen large. The MOSFET 526 and the current source I1 528 may be used to set the bias voltage for amplifier A1 512. In accordance with various embodiments of the invention, the amplifier A1 512 may be implemented in multiple, low gain stages to provide varying levels of stability.

In accordance with an embodiment of the invention, a method and system for precise current matching in deep sub-micron technology may comprise one or more circuits as shown in FIG. 2, FIG. 3, FIG. 4 and FIG. 5 that adjust a current mirror to compensate for MOSFET gate leakage current using a feedback circuit. As shown in FIG. 2, FIG. 3, FIG. 4 and FIG. 5, the feedback circuit may be implemented with active elements.

In the case of a noisy reference current I1 as illustrated in FIG. 2, FIG. 3, FIG. 4 and FIG. 5, a noisy reference voltage may result. The output current I2 may be smoothed by using a low-pass filter coupled to the current mirror. In FIG. 2, the low-pass filter may comprise resistor R1 210 and MOSFET C1 216. In FIG. 3, the low-pass filter may comprise resistor R1 314 and MOSFET C1 312. In FIG. 4, the low-pass filter may comprise resistor R1 418 and MOSFET C1 420. In FIG. 5, the low-pass filter may comprise the resistor R1 514 and the MOSFET C1 516.

The active feedback illustrated in FIG. 2, FIG. 3, FIG. 4 and FIG. 5 may be implemented by amplifiers as shown by amplifier A1 214, 310, 416 and 512, respectively. To reduce noise or for other implementation advantages, it may be desirable to use multiple amplifier stages for the amplifiers A1 214, 310, 416 and 512. A transimpedance amplifier may also be utilized as illustrated in FIG. 5.

In accordance with different embodiments of the invention, subsequent to low-pass filtering, the output bias voltage or the output bias current may be sensed by an error-sensing amplifier. In FIG. 2, the output bias voltage may be measured directly at n2. In FIG. 3 and FIG. 4, the bias current I1 may be converted to a voltage proportional to the bias current by means of the resistors R2 306, 316 and 406 and 422, respectively. Then, the voltage may be sensed in the feedback amplifier A1 310 and A1 416, respectively. In FIG. 5, the bias current may be sensed directly since the transimpedance amplifier 508 may act as a current-to-voltage converter. The adjusting of the feedback may stabilize the output bias current I2 through MOSFET M2, as shown in FIG. 2, FIG. 3, FIG. 4 and FIG. 5. Due to the feedback circuits, the output bias current I2 may be dynamically adjusted. The current mirrors as illustrated in FIG. 2, FIG. 4 and FIG. 5 may comprise more than one current source.

Accordingly, the present invention may be realized in hardware, software, or a combination of hardware and software. The present invention may be realized in a centralized fashion in at least one computer system, or in a distributed fashion where different elements are spread across several intercoupled computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for controlling MOSFET Circuits, the method comprising:

adjusting a current mirror to compensate for MOSFET gate leakage current and stabilizing an output bias current using a feedback circuit comprising an amplifier, wherein an input signal to said amplifier comprises a signal from an output replicating branch of said current mirror;

smoothing noisy voltage resulting from a noisy reference current source using a low-pass filter in said current mirror; and configuring, by said amplifier, a gate voltage of said low pass filter.

2. The method according to claim 1, wherein said feedback circuit is an active feedback circuit.

3. The method according to claim 1, wherein said amplifier amplifies a bias voltage error.

4. The method according to claim 1, wherein said amplifier amplifies a bias current error.

5. The method according to claim 1, wherein said amplifier comprises one or more amplifier stages.

6. The method according to claim 1, wherein said adjusting occurs dynamically.

7. The method according to claim 1, wherein said current mirror comprises one or more current sources.

8. A system for controlling MOSFET Circuits, the system comprising:

one or more circuits comprising a feedback circuit which comprises an amplifier, wherein an input signal to said amplifier comprises a signal from an output replicating branch of said current mirror, said one or more circuits adjusts a current mirror to compensate for MOSFET gate leakage current and to stabilize an output bias current;

said one or more circuits smoothes noisy voltage resulting from a noisy reference current source using a low-pass filter in said current mirror; and said one or more circuits configures a gate voltage of said low pass filter via said amplifier.

9. The system according to claim 8, wherein said feedback circuit is an active feedback circuit.

10. The system according to claim 8, wherein said amplifier amplifies a bias voltage error.

11. The system according to claim 8, wherein said amplifier amplifies a bias current error.

12. The system according to claim 8, wherein said amplifier comprises one or more amplifier stages.

13. The system according to claim 8, wherein said adjusting occurs dynamically.

14. The system according to claim 8, wherein said current mirror comprises one or more current sources.

* * * * *